United States Patent [19]

Alles et al.

[11] 4,159,799
[45] Jul. 3, 1979

[54] CASSETTE UNIT AND FIXTURE FOR LOADING THE UNIT WITH A PLANAR MEMBER

[75] Inventors: David S. Alles, Convent Station; Joseph Hill, Middlesex, both of N.J.

[73] Assignee: Bell Telephone Laboratories, Incorporated, Murray Hill, N.J.

[21] Appl. No.: 860,338

[22] Filed: Dec. 14, 1977

[51] Int. Cl.² .................. G06K 7/00; G06K 7/04; G06K 13/16
[52] U.S. Cl. .................................... 235/486; 235/453
[58] Field of Search .............. 360/2, 81, 88; 235/483, 235/484, 485, 453, 486; 340/149 A; 250/569; 194/DIG. 14; 340/146.3 R, 146.3 G; 271/8 R

[56] References Cited
U.S. PATENT DOCUMENTS

| | | |
|---|---|---|
| 3,530,448 | 9/1970 | Clancy .................................... 360/53 |
| 3,534,397 | 10/1970 | McWade .............................. 235/453 |
| 3,790,758 | 2/1974 | Tanigawa ............................. 235/483 |
| 3,959,623 | 5/1976 | Nakahara ............................. 271/8 R |
| 4,036,430 | 7/1977 | Eppich ................................. 235/485 |
| 4,087,680 | 5/1978 | Mack ................................... 235/449 |

Primary Examiner—Robert M. Kilgore
Attorney, Agent, or Firm—Lucian C. Canepa

[57] ABSTRACT

In fabricating very-high-resolution devices with a lithographic tool such as an EBES machine, it is crucial that the planar mask or wafer members utilized therein be loaded into and maintained in the work chamber of the machine in a way that minimally affects their planarity. In accordance with the present invention this is accomplished by loading each member into a three-point-suspension cassette unit by means of a fixture that performs the loading in a precise and essentially stress-free manner.

8 Claims, 4 Drawing Figures

CASSETTE UNIT AND FIXTURE FOR LOADING THE UNIT WITH A PLANAR MEMBER

BACKGROUND OF THE INVENTION

This invention relates to a cassette unit and to a fixture for loading the unit with a planar member.

In a number of practical applications, it is important that a planar member be held securely in a specified orientation while the surface of the member is being processed in a prescribed way. For example, in an electron beam exposure system (EBES) of the type described in *IEEE Transactions on Electron Devices*, Vol. ED-22, No. 7, July 1975, pages 385–392, a resist-coated substrate to be patterned is mounted on a motor-driven table which translates the substrate in an XY plane normal to a main longitudinal axis along which a deflectable electron beam is propagated. For high-quality fine-featured processing in an EBES machine, it is essential that out-of-plane motion of the writing surface of the resist-coated substrate be less than several microns. This obviously imposes severe restrictions and requirements both on the mechanical design of EBES and on the design of the cassette units utilized to hold substrates for processing in the machine.

Accordingly, considerable effort has been directed at trying to devise a cassette unit for holding a planar member in a substantially distortion-free manner. In the course of working toward this goal it was recognized that both an improved cassette unit and an associated special fixture for loading the planar member into the unit would be required.

SUMMARY OF THE INVENTION

Hence, an object of the present invention is a cassette unit for precisely holding a planar member in a prescribed orientation and an associated fixture for mounting the member in the unit in an accurate and substantially stress-free way.

Briefly, this and other objects of the present invention are realized in a specific illustrative embodiment thereof that comprises a cassette unit including a three-point suspension system with a fixed-location spring-loaded clamping member at each suspension point. An empty cassette unit to be loaded with a planar member is mounted in a fixture that includes three clamping member actuators for maintaining the clamping members of the unit in an open condition when the unit is secured in place in the fixture. A planar member to be loaded into the unit is mounted on a movable table portion of the fixture. The table, which includes a reference stop member, is then moved toward the cassette unit to position the planar member in adjacent non-contacting relationship with the unit free of any side wall portions thereof and encompassed between but not in contact with the open clamping members. The reference stop member is designed to engage the cassette unit when the planar member has been moved into loading registry with the unit. In response to such engagement, the cassette unit is released from its mounted position, whereby the spring-loaded clamping members are enabled to move relative to the actuators to securely grip the planar member at the noted three suspension points. The member-carrying unit is then free to be removed from the fixture and loaded into some appropriate processing system such as an EBES machine.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

For the purpose of giving a specific example, the cassette unit to be described in detail hereinbelow will be assumed to be of a particular type well suited for use in an EBES machine. It is to be understood, however, that both the cassette unit and the loading fixture designed therefor are general purpose in nature. A variety of other advantageous uses and applications for the unit and fixture described herein, as well as various straightforward structural modifications that can be made thereto, will be apparent to workers in the art.

Figure 1:
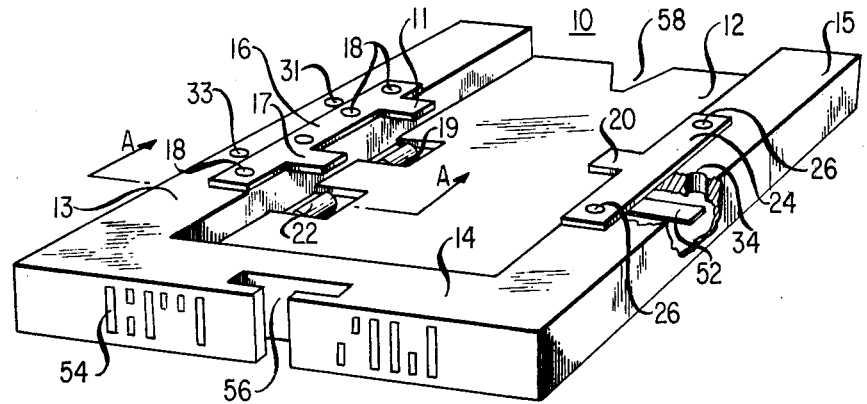
FIG. 1 shows a specific illustrative cassette unit made in accordance with an aspect of the principles of the present invention.

Illustratively, the cassette unit 10 shown in FIG. 1 comprises a stiff low-cost main member 12 which advantageously is machined out of a single piece of stock material made of a non-magnetic substance such as aluminum. The top side of the main member 12 comprises a flat surface bounded by perimeter members 13 through 15. An element 16 made, for example, of molybdenum is secured to the top of the perimeter member 13 by screws 18 or other suitable fasteners. The element 16 includes two extending portions 11 and 17 whose bottom surfaces are respectively disposed directly above and spaced apart from spring-loaded clamping members 19 and 22 that each comprise, for example, a cylindrical nylon roller. Together, the bottom surface of each of the portions 11 and 17 and the associated member 19 or 22 constitute a portion of one of three clamping assemblies included in the cassette unit 10 for securely holding a planar member therein. Holes 31 and 33, whose purpose will be described below, are included in the perimeter member 13 respectively adjacent the specified clamping assemblies.

An element 24 (FIG. 1) also made, for example, of molybdenum is secured by suitable fasteners 26 to the top of the perimeter member 15. The element 24 includes an extending portion 20 whose configuration and function are the same as those of the aforedescribed portions 11 and 17. Illustratively, the portion 20 is also disposed directly over an associated roller member (not shown) thereby to constitute portions of an additional clamping assembly for retaining a planar member. Adjacent this additional assembly is a hole in the perimeter member 15, which hole is not shown in the drawing because it is included in that portion of the perimeter member 15 that is broken away in FIG. 1.

Each of the clamping assemblies included in the cassette unit 10 of FIG. 1 is capable of being actuated by an associated pin member that is mounted in a fixture (to be described later below). Thus, as seen in FIG. 2, which is a cross-sectional side view of that portion of the unit 10 indicated by lines A—A in FIG. 1, pin member 32 extends through the hole 33 in perimeter member 13 to move the clamping assembly including roller 22 to its open position.

Figure 2:
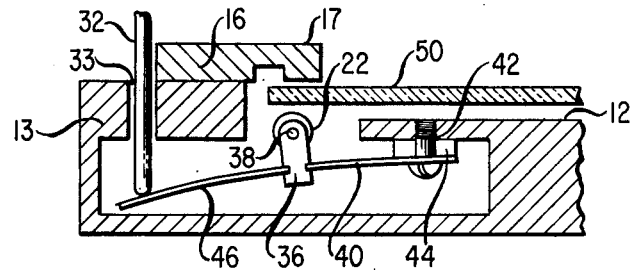
FIGS. 2 and 3 each depict in cross-section a portion of the FIG. 1 unit.

Illustratively, the mechanism shown in FIG. 2 for retaining and moving the cylindrical roller 22 includes a U-shaped frame 36 supporting a rod 38 on which the roller is rotatably mounted. In turn, the frame 36 is securely attached to the main member 12 of the cassette unit by a non-magnetic spring member 40 made, for example, of phosphor bronze. By way of example, the right-hand end of the member 40 is secured to the member 12 by a screw 42 and a spacer 44.

Also securely attached to the frame 36 of FIG. 2 is an arm 46 whose left-hand or free end is positioned in alignment with the hole 33 and designed to be moved downward by insertion of the pin 32 in the hole 33. When the pin 32 is fully inserted therein, the roller 22 is moved to its disengaged or open position, as represented in FIG. 2.

In the depicted open position, the clamping assembly of FIG. 2 provides sufficient clearance between the top of the roller 22 and the bottom of the extending portion 17 of the perimeter member 16 for a planar member 50 to be inserted therebetween in non-contacting relationship therewith.

Figure 3:
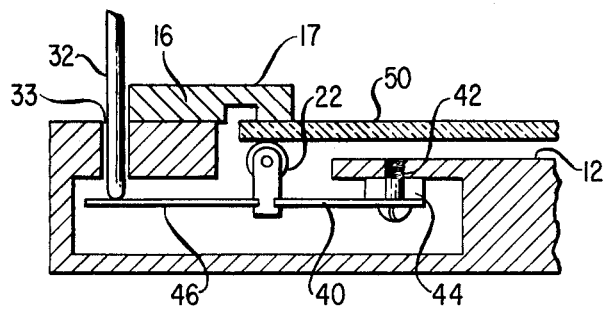

On the other hand, when the relative position between the pin 32 and the arm 46 is as shown in FIG. 3, the spring member 40 is effective to move the roller 22 to securely engage the planar member 50 between the roller and the bottom surface of the extending portion 17 of the perimeter member 16.

Each of the other two clamping assemblies included in the cassette unit 10 of FIG. 1 is identical to the aforedescribed assembly shown in FIGS. 2 and 3. Only arm 52 of the clamping assembly associated with the extending portion 20 is shown in FIG. 1. The arm 52 is intended to be engaged by an associated pin (not shown) thereby to control whether the assembly including the portion 20 is in its open position or in a position to securely engage one of three spaced-apart small-area portions of an associated planar member.

The particular illustrative cassette unit 10 shown in FIG. 1 includes standard bar code markings 54 on the front side of the unit. These markings, which constitute, for example, the identification number of the unit 10, are designed to be read by a code reader included in the fixture to be described below. The unit 10 also includes in the front portion thereof a key slot 56 by means of which a loading rod (not shown herein) engages the unit for insertion into the loading chamber of an EBES machine. In addition, the unit 10 includes in the back portion thereof an indented region 58 whose purpose will be evident from the description later below.

In summary, an advantageous low-cost cassette unit 10 has been described above. The unit is characterized by a unique three-point suspension system comprising the aforedescribed three clamping assemblies for holding a planar member. In practice, it has been determined that such a suspension system minimizes the introduction of out-of-plane distortions in the planar member arising from distortions in the unit itself. Moreover, the unit 10 is designed to hold a planar member therein without contacting the sides of the member. In that way, possible distortion of the member by side forces is avoided. Further, the aforedescribed suspension system is characterized by fixed-location clamping springs that insure precise alignment between the gripping parts of each clamping assembly. In that way, bending moments that could cause distortions in the planar member are avoided.

Figure 4:
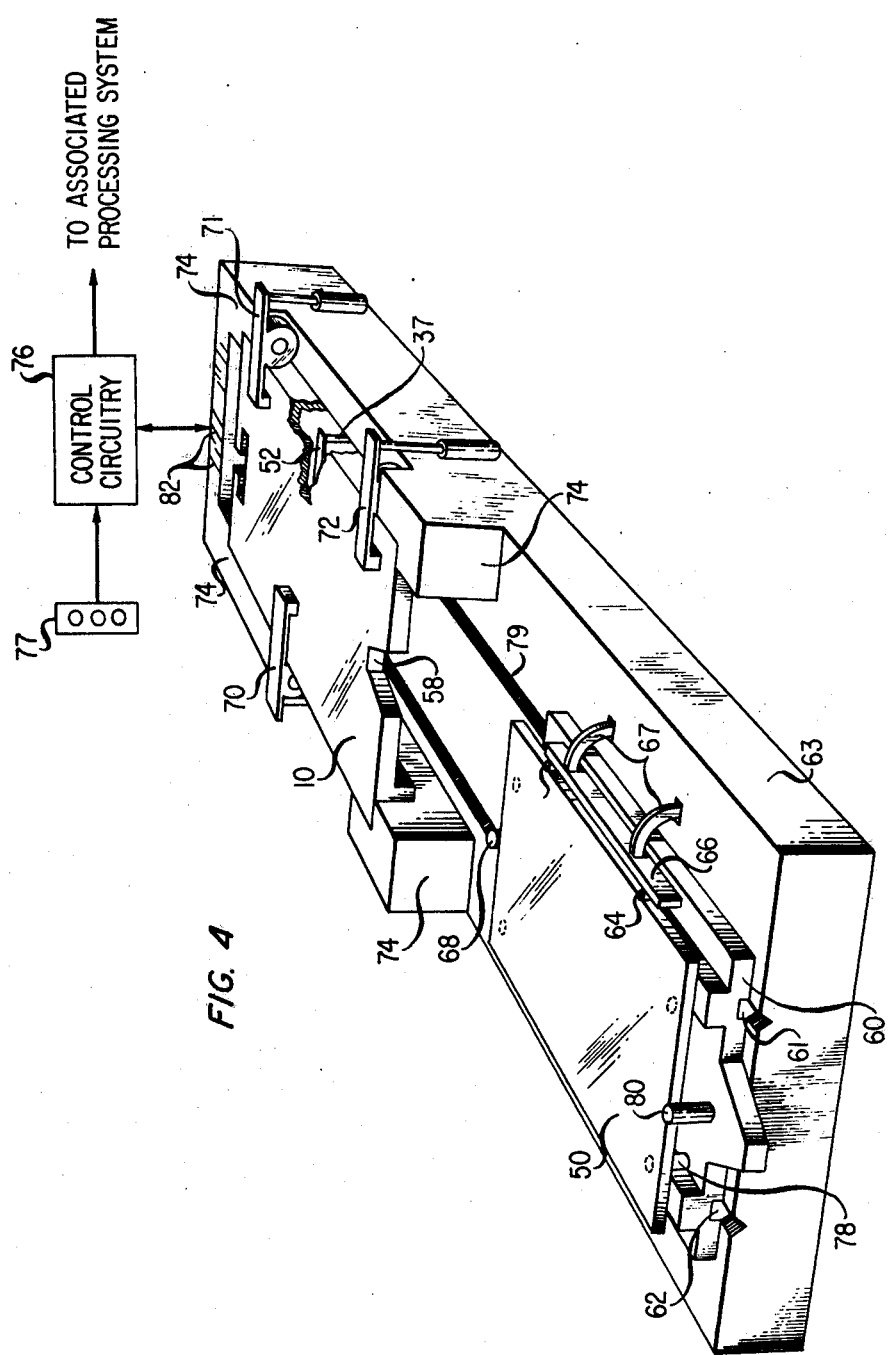
FIG. 4 shows the FIG. 1 unit and a planar member both mounted in a specific illustrative fixture that embodies other aspects of the principles of this invention.

A specific illustrative fixture made in accordance with an aspect of the principles of the present invention is depicted in FIG. 4. A planar member 50 and a cassette unit 10 of the type described above are shown mounted in the fixture. By way of a specific example, the member 50 may be considered to constitute a substrate comprising a flat piece of glass about 0.090 inches thick having a chromium film deposited on the bottom surface thereof. In turn, a thin layer of a suitable electron-beam-sensitive resist material is deposited on the chromium film. Such a member is a mask blank of the type processed by an EBES machine to form a high-quality fine-featured master mask pattern for use in making integrated circuits. Advantageously, the member 50 is mounted in the depicted fixture with its resist surface down, which minimizes the possibility of particulate contamination of the resist material during the loading operation to be carried out in the fixture.

The member 50 is manually placed on the fixture of FIG. 4 by positioning the member on top of a slidably movable table 60. Initially, the table 60 is located against stop members 61 and 62 that are secured to a main base member 63 of the depicted fixture. In locating the member 50 on the table 60, the right-hand side of the member is placed against retractable pin elements 64 and 65 that are secured to a bar 66 affixed to movable arms 67. At the same time, the back or rear side of the member 50 is placed against a retractable pin element 68. In that way, the member 50 is accurately positioned in abutting relationship with the pins 64, 65 and 68 in an initial predetermined location on the table 60.

The fixture of FIG. 4 includes three clamping mechanisms 70 through 72 designed to hold the cassette unit 10 securely in position on a mounting ledge formed in a three-sided raised portion 74 of the depicted fixture. Initially, in response to signals supplied from standard control circuitry 76, the mechanisms 70 through 72 are disengaged or retracted from their depicted locking positions. As a result, sufficient clearance exists for manually inserting the unit 10 in a predetermined position in the fixture on the specified ledge. When so inserted, three pin members mounted on the fixture respectively extend partially into the three aforespecified holes formed in the perimeter members of the cassette unit. Only one such pin member, designated by reference numeral 37, is shown in FIG. 4. As indicated in FIG. 4, the pin member 37 is mounted in alignment with the arm 52 of one of the clamping mechanisms included in the cassette unit 10.

Initially, that is, when the mechanisms 70 through 72 are disengaged, the cassette unit 10 of FIG. 4 is supported by the three aforespecified pin members in an elevated position slightly above the mounting ledge of the fixture. In that position, the clamping mechanisms are in the closed condition represented in FIG. 3. Loading of the planar member 50 into the unit 10 is not designed to occur until the mechanisms 70 through 72 are subsequently engaged to force the unit 10 down into contact with the mounting ledge of the fixture.

Engagement of the clamping mechanisms 70 through 72 is controlled by the circuitry 76 of FIG. 4. In turn, engaging signals cannot be transmitted from the circuitry 76 to the mechanisms 70 through 72 until an operator's control panel 77 has been actuated. Thus, for example, in one particular embodiment, the panel 77 includes plural push-buttons each representative of one of the types of resist material that can be coated on the planar mask member 50 for utilization in an EBES machine. In response to manual actuation of one of the push-buttons on the panel 77, the circuitry 76 applies control signals to the depicted fixture to cause the mechanisms 70 through 72 to clamp the cassette unit in place on the aforementioned mounting ledge. As a result, the noted pin members (such as the member 37) cause their respectively associated clamping assemblies to be moved to their open positions (represented in FIG. 2).

Additional control signals are applied by the circuitry 76 to the fixture of FIG. 4 to actuate four standard vacuum chucks that have their top surfaces in engagement with the underside of the planar member 50. A portion 78 of one of these chucks is shown in FIG. 4. Four dashed-line circles on the top surface of the member 50 are included in the drawing simply to indicate the respective locations of the chucks. After the vacuum chucks are actuated, still additional control signals from the circuitry 76 are effective to cause the positioning pins 64, 65 and 68 to be retracted from the sides of the member 50. At that point the table 60 is ready to be moved manually along track 79 into loading registry with the securely mounted cassette unit 10. During such movement the member 50 is held securely in place on the table by the aforespecified vacuum hold-down units.

Fixedly mounted on the movable table 60 of FIG. 4 is a reference stop member 80. This member is designed to contact indented region 58 of the mounted cassette unit 10 thereby to stop movement of the table 60 at a prescribed point on the fixture. At that point the planar member 50 is in exact loading registry with the cassette unit 10. When the member 50 and the unit 10 are in such registry, the orientation of the member 50 with respect to each of the three suspension assemblies included in the unit 10 is as represented in FIG. 2. In that position the member 50 is supported by the aforedescribed vacuum chucks in non-contacting relationship with the pair of clamping elements included in each suspension assembly. Moreover, in that position the sides of the member 50 are free of any side wall portions of the cassette unit 10.

In one embodiment of the specific illustrative apparatus shown in FIG. 4, electrical leads (not shown) respectively contact the reference stop member 80 and the mounted metallic unit 10. In turn these leads extend to the control circuitry 76. Accordingly, when the member 80 contacts the unit 10, an electrical signal is applied to the circuitry 76 to indicate that the planar member 50 is positioned in loading registry with the unit 10. In response thereto, the circuitry 76 applies signals to the depicted fixture to cause release of the clamping mechanisms 70 through 72 and, in addition, to cause the vacuum chucks (such as the unit 78) to release the planar member 50. As the mechanisms 70 through 72 retract, they allow the unit 10 to move upwards on the pin members (such as the member 37) in response to forces exerted on the pin members by the springs included in the suspension assemblies (such as the spring member 40 shown in FIGS. 2 and 3). Consequently, the planar member 50 is both moved upwards and firmly but resiliently clamped in place in the cassette unit 10 by the three aforedescribed suspension assemblies. Thereafter, the unit 10 with the member 50 mounted therein is available to be manually lifted free of the fixture shown in FIG. 4 and then inserted, for example, into the loading chamber of an EBES machine.

Illustratively, the fixture of FIG. 4 also includes a standard optical or magnetic sensing unit 82 for reading the aforementioned bar code information contained on the end of the cassette unit 10. This information, together with that supplied to the circuitry 76 from the panel 77, specifies, for example, that a cassette unit having a preassigned identification number has been loaded with a mask blank coated with a particular operator-specified resist material. In turn, this information is advantageously applied to an associated data processing system that controls the operation of the apparatus (for example, an EBES machine) into which the loaded cassette unit is to be placed for processing.

Finally, it is to be understood that the various above-described arrangements are only illustrative of the application of the principles of the present invention. In accordance with these principles, numerous other modifications and variations may be devised by those skilled in the art without departing from the spirit and scope of the invention.

What is claimed is:

1. Apparatus for moving a planar member from an initial loading position to an intermediate position in which the member is located in an adjacent non-contacting registration with respect to a cassette unit that is mountable in said apparatus, said apparatus being adapted to move said member from its intermediate position to a final retaining position wherein said member is securely clamped in said unit by three suspension assemblies included in said unit and said unit is at the same time released from said apparatus for removal therefrom, said apparatus comprising a base member, means mounted on said base member for moving a planar member between said loading and intermediate positions, retractable clamping means mounted on said base member for securely clamping a cassette unit in place in said apparatus when said clamping means is engaged, and means mounted on said base member for engaging the suspension assemblies in said unit to maintain each assembly in an open position when said unit is securely clamped in place in said apparatus by said clamping means and for allowing said assemblies to close to engage a planar member positioned in registration with said cassette unit when said clamping means is retracted.

2. Apparatus as in claim 1 further including means for controlling the engagement and retraction of said clamping means.

3. Apparatus for positioning a planar member in a stress-free way in a cassette unit that includes a three-assembly suspension system having a fixed-location spring-loaded clamp member included in each suspension assembly, said apparatus comprising a base member, unit hold-down means mounted on said base member for securely holding a cassette unit in place, clamp-member actuators mounted on said base member for maintaining said spring-loaded clamp members in an open position when said unit is secured in place by said hold-down means, movable means slidably mounted on said base member and spaced apart from said holding means for receiving a planar member to be loaded into said unit, said movable means including retractable means for initially engaging the edges of said member to establish a predetermined position of said member on said movable means, and member hold-down means for holding said member in said predetermined position as said movable means is moved toward said unit, said movably means being adapted to move said member into adjacent non-contacting relationship with said unit free of any side-wall portions thereof and encompassed between but not in contact with said open clamp members during said movement, said movable means also including a reference stop member for engagement with said unit when said member has been moved into loading registry with said unit, and means responsive to said stop member engaging said unit for releasing said unit hold-down means and said member hold-down means so that said spring-loaded clamp members are enabled to move relative to said actuators to securely engage said member and said unit is at the same time released from said apparatus.

4. Apparatus as in claim 3 wherein each cassette unit designed to be held in said apparatus includes code information thereon uniquely identifying the unit, and wherein said apparatus further includes means for reading the code information contained on a unit held in said apparatus.

5. Apparatus as in claim 4 further including control circuitry, means for applying signals to said control circuitry indicative of the nature of each planar member placed on said movable means, and means for applying signals from said reading means to said control circuitry.

6. A cassette unit adapted to hold a planar member therein in a suspended manner in which minimal distortion-inducing forces are applied to said member, said unit comprising a base member having a main planar surface, and three suspension assemblies mounted on said base member for respectively clamping three spaced-apart portions of a planar member to hold said member in a suspended fashion above said surface.

7. A unit as in claim 6 wherein each of said assemblies comprises a fixed element and a spring-loaded moveable element for respectively engaging correspondingly opposed sides of one of said portions.

8. A unit as in claim 7 wherein each of said assemblies further includes means for moving said spring-loaded element away from said associated fixed element to provide sufficient clearance therebetween to allow a planar member to be brought into loading registry with said unit wherein said portions are respectively encompassed between the elements of said assemblies in non-contacting aligned relationship therewith.

* * * * *